United States Patent [19]
Brigati et al.

[11] Patent Number: 6,011,724
[45] Date of Patent: Jan. 4, 2000

[54] CIRCUIT AND METHOD FOR THE ERASURE OF A NON-VOLATILE AND ELECTRICALLY ERASABLE MEMORY

[75] Inventors: Alessandro Brigati, Castelsangiovanni, Italy; Jean Devin, Le Tholonet; Bruno LeConte, Rousset, both of France

[73] Assignee: SGS-Thomson Microelectronics S.A., Saint Genis, France

[21] Appl. No.: 08/980,195

[22] Filed: Nov. 26, 1997

[30] Foreign Application Priority Data

Nov. 28, 1996 [FR] France .................................. 96 14777

[51] Int. Cl.⁷ .................................................. G11C 11/34
[52] U.S. Cl. ................................ 365/185.29; 365/189.09
[58] Field of Search ........................... 365/185.29, 189.09

[56] References Cited

U.S. PATENT DOCUMENTS

| | | | |
|---|---|---|---|
| 5,475,249 | 12/1995 | Watsuji et al. ...................... | 365/189.07 |
| 5,617,359 | 4/1997 | Ninomiya ............................ | 365/185.29 |
| 5,619,451 | 4/1997 | Costabello et al. ..................... | 365/185 |
| 5,724,289 | 3/1998 | Watanabe ................................ | 365/201 |

FOREIGN PATENT DOCUMENTS

| | | |
|---|---|---|
| 0 432 050 | 6/1991 | European Pat. Off. ........ G11C 16/06 |
| 0 701 259 | 3/1996 | European Pat. Off. ........ G11C 16/06 |
| WO 96/18193 | 6/1996 | WIPO .............................. G11C 6/06 |

OTHER PUBLICATIONS

French Search Report from French application No. 9614777, filed Nov. 28, 1996.

An Improved Method for Programming a Word–Erasable EEPROM, Torelli et al., Alta Frequenza, vol. 52, No. 6, Nov. 1983, pp. 487–494.

Introduction to MOS LSI Design, Mayor et al., addison-–wesley Pub. Co., Jun. 12, 1991 pp. 93–96 1983.

*Primary Examiner*—Trong Phan
*Assistant Examiner*—M. Tran
*Attorney, Agent, or Firm*—Wolf, Greenfield & Sacks, P.C.

[57] ABSTRACT

A method for the erasure of a non-volatile and electrically erasable memory in which the amplitude of the pulses that are sent to erase the memory varies as a function of the number of pulses previously sent. A circuit for the generation of erasure pulses of variable amplitude for a non-volatile and electrically erasable memory.

25 Claims, 2 Drawing Sheets

CIRCUIT AND METHOD FOR THE ERASURE OF A NON-VOLATILE AND ELECTRICALLY ERASABLE MEMORY

BACKGROUND OF THE INVENTION

1. Field of the Invention

The invention relates to a circuit and method for the erasure of a non-volatile and electrically erasable memory. The invention relates more particularly to FLASH type memories and also to block-erasable EEPROM type memories.

2. Discussion of Related Art

The erasure of FLASH (and EEPROM) type memories is currently done by tunnel effect (or Fowler Nordheim effect). In FLASH memories, the erasure is done on all the memory cells or at least on a block of memory cells. This type of erasure is also performed in certain types of EEPROMs.

To erase a memory area, all the cells are initially preprogrammed and then, in order to carry out an erasure by tunnel effect, a voltage of 0V (or a negative voltage) is applied to the gates of the storage transistors and a voltage of about 10V (or more) is applied to the sources of the storage transistors, the drains of the transistors being left in a floating state. For EEPROM type memories, the various voltages are applied during a certain period of time calculated so that all the cells are in an erased state. As a result, certain cells that react more quickly than the others have their floating gates positively charged, making the storage transistor always conductive without taking into account the gate voltage. For the EEPROMs, this problem results in a slightly greater expenditure of energy during the programming.

With regard to FLASH type memories, this problem should not arise since FLASH memories are directly controlled by the gate of the storage transistor and have no selection transistors available. The approach that is currently being developed consists in sending a series of pulses to the source with an amplitude of approximately 10V and a duration of approximately 10 ms and checking, after each pulse, to determine if the cells are properly erased. The pulses are sent until all the cells are erased or until the end of a defined number of pulses, up to a maximum of 1000. In general, a sorting is done by the manufacturer so that all commercially distributed memories get erased well before the maximum number of pulses is reached. To correct the phenomenon of depletion caused by the excessively quick erasure of the cells, a partial programming stage comprises a cell-by-cell rectification of the levels of the excessively sensitive cells.

Although pulses of approximately 10V are necessary to deprogram the cells, there is a certain degree of variation resulting, for example, from manufacturing defects or a wearing out of the cell characterized by cells that get erased too quickly or too slowly. In other words, some memories are declared to be defective during manufacture or wear out prematurely which makes them unusable because a single pulse of approximately 10V turns them constantly on or because a series of pulses does not erase them.

SUMMARY OF THE INVENTION

In order to overcome the problem of lengthy erasure which can deplete the electrically erasable memory cells, the invention proposes to send a sequence of pulses of variable amplitude in order to erase the storage transistors of an electrically erasable memory as uniformly as possible while making the erasure more gradual than in the prior art.

An object of the invention is a method for the erasure of a non-volatile and electrically erasable memory in which a sequence of pulses are sent in order to create an erasure voltage between the source and the gate of each storage transistor of an area of the memory until each of the transistors is erased. The amplitudes of the pulses vary according to the number of pulses previously sent and after each pulse, the state of each storage transistor is tested in order to determine if another pulse must be applied.

Preferably, the pulses are applied to minimum groups of storage transistors where each group can be individually disconnected from the erasure device. In order to control the effect of the pulses more efficiently, an increasing erasure voltage is used by the addition of a voltage that is a multiple of a constant step. For reasons of space requirement, the number of possible values for the erasure voltage is smaller than a maximum number of pulses.

Another goal of the invention is to obtain a pulse generation device that can provide pulses of variable amplitude.

An object of the invention, therefore, is also a circuit for the generation of erasure pulses for a non-volatile and electrically erasable memory. The circuit includes a pulse output connected to a switch controlled by a fixed-amplitude pulse generator. The circuit includes a controllable voltage source whose voltage output is connected to the pulse output through the switch, and a reaction circuit that acts on a control signal of the controllable voltage source as a function of the number of pulses already provided.

Preferably, the controllable voltage source is a voltage pump controlled by the reaction circuit which acts on an oscillator associated with the voltage pump. The reaction circuit includes a pump regulator controlled by a logic circuit as a function of the number of pulses already given.

One improvement is aimed at enabling the manufacturer to have a device for the generation of pulses of variable amplitude that can be quickly modified in order to enable the modification of the circuit after tests have been carried out on a first series of memories or in order to improve the product after it has been initially put on the market.

The use, in the reaction circuit of a ROM type memory that contains a control sequence for the controllable voltage source provides for great flexibility of use. This flexibility of use is further improved if the ROM type memory is programmable on a metal layer.

To reduce the size of the reaction circuit, the logic circuit includes a shift register type of counter that receives an initialization signal at the beginning of an erasure sequence and has its pace set by the fixed-amplitude pulse generator, with outputs of the shift register being directly connected to word lines of the ROM type memory.

BRIEF DESCRIPTION OF THE DRAWINGS

The invention will be understood more clearly and other advantages will appear from the following description made with reference to the appended drawings of which.

DETAILED DESCRIPTION

Figure 1:
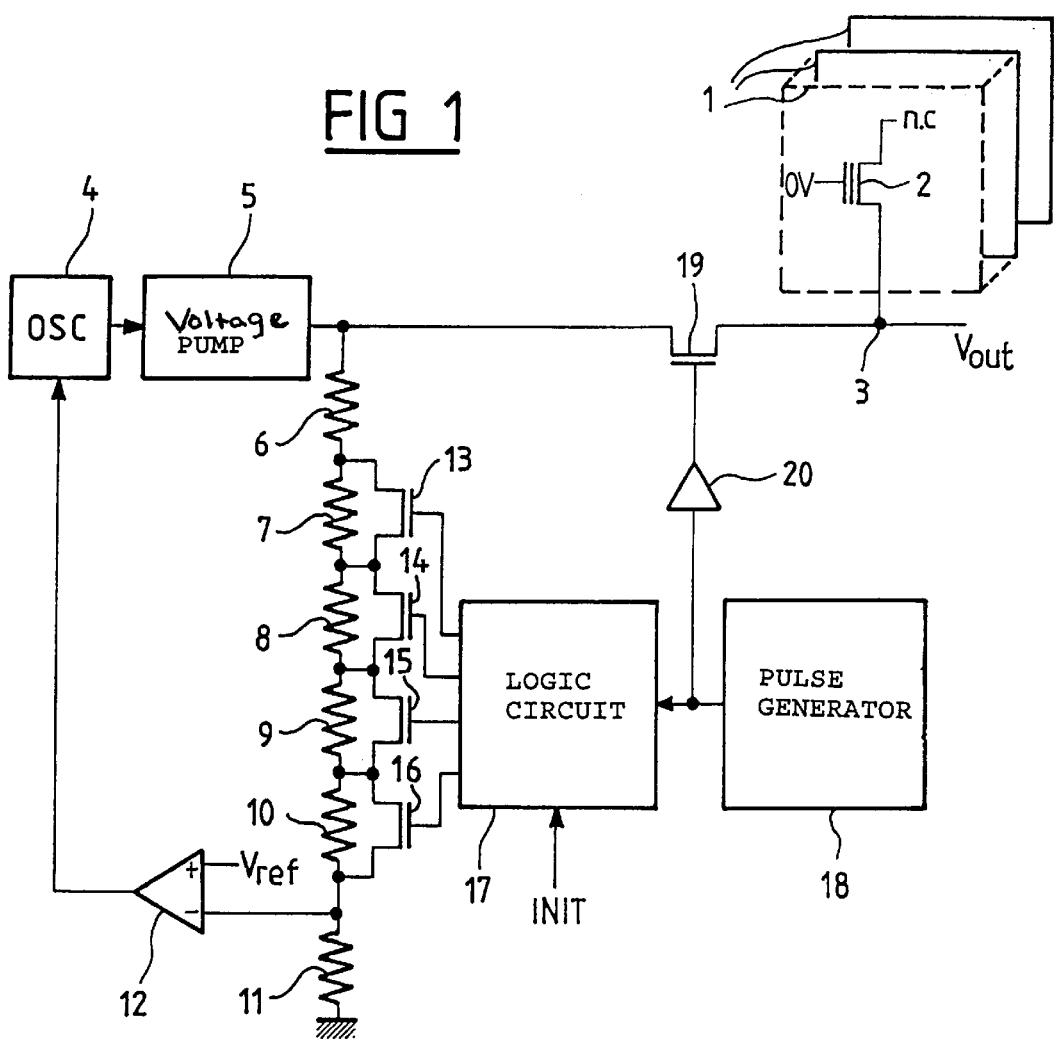
FIG. 1 shows an embodiment of the invention.

FIG. 1 provides a diagrammatic view of the invention. Memory cells 1, which are FLASH type cells in this example, each including a floating-gate storage transistor 2, are shown in the manner in which they are connected when pulses are sent to erase the storage transistor 2. The drain of the storage transistor 2 is not connected. The gate receives a potential of 0V and the source is connected to a node 3.

Of course, in a test phase that is used to check the state of the memory cells, the connections are different. Moreover, certain choices of connections are arbitrary and can be modified. The drain could, for example, be connected to the source or the gate could, for example, receive a negative potential.

The node 3 corresponds to the output of the variable-amplitude pulse generation device that is the object of the invention as shown in FIG. 1.

The variable-amplitude pulse generation device includes a controlled oscillator 4 having one control input and one output, the output of the oscillator providing a clock signal if the signal present on the input is in a first state.

The device also includes a voltage pump 5 having an input and an output, the input being connected to the output of the oscillator 4, the output providing a pumped signal at most equal to a multiple of the supply voltage when the clock signal is oscillating.

In addition, a bridge of six impedors 6 to 11, is series-connected between the output of the voltage pump 5 and a first reference voltage, the first reference voltage being, for example, ground. The six impedors 6 to 11 may include MOS transistors assembled as diodes or resistors.

Further included in the variable-amplitude pulse generation device is a comparator 12 having first and second inputs and an output. The first input is connected between two impedors 10 and 11 of the bridge of impedors and the second input receives a second reference voltage. The output is connected to the control input of the oscillator 4. The second reference voltage should be precise (for example a "band gap" could be used), since the comparator output 12 provides a signal that can take two states depending on whether the voltage present at the first input is higher or lower than the second reference voltage.

As shown in FIG. 1, the device also includes four shunt transistors 13 to 16 whose sources and drains are connected to respectively short-circuit four of the impedors 7 to 10 as a function of the signal present at their gates. The channel resistance of these shunt transistors is substantially lower than any resistance that may exist from impedance-mounted transistors.

The device further includes a logic circuit 17 having an initialization input, a pulse input and four control outputs. The four control outputs are connected respectively to the gates of the four shunt transistors 13 to 16. The initialization input receives an initialization signal INIT, and the logic circuit 17 provides different commands on its outputs as a function of the number of pulses received since a transition of the initialization signal INIT.

A pulse generator 18 has an output connected to the pulse input of the logic circuit 17 that gives fixed-amplitude pulses. The pulse generator 18 provides the pulses as long as is necessary according to the same principle used in conventional pulse generators.

Also included is a switch-over transistor 19 whose drain is connected to the output of the voltage pump 5 and whose source is connected to node 3.

A logic signal amplifier 20 has an input and an output. The input is connected to the output of the pulse generator 18 and the output is connected to the gate of the switch-over transistor 19. The amplifier 20 is used to convert a logic signal, that varies for example between 0V and 3V, into a gate control signal varying, for example, between 0V and the output voltage of the voltage pump.

In this circuit, those skilled in the art will easily be able to understand that equivalent elements could be substituted.

The switch-over transistor 19 and the amplifier 20 comprise a controlled switch. There are many conventional controlled switches available that can be integrated into a chip in an integrated circuit.

The oscillator 4 and the voltage pump 5 constitute a controllable voltage source. It is possible, for example, to use an input terminal of the integrated circuit to receive an external voltage and use a voltage-lowering, regulator. A digital/analog converter can for example be used as a digitally controlled regulator, but the surface area occupied is greater.

The bridge of impedors 6 to 11, the comparator 12, the shunt transistors 13 to 16 and the logic circuit 17 constitute a reaction circuit that acts on the controllable voltage source according to a number of pulses received from the pulse generator 18.

Many alternatives are possible. It is possible, for example, to use a current mirror device or one of the many voltage pump regulator circuits. The reaction circuit can also be a counter that directly controls a voltage source digital regulator including, for example, a D/A converter. Other modifications are possible without modifying the goal of the invention.

Thus, the storage transistor 2 can be connected to the node 3 by means of a selection transistor specific to each memory cell 1 or common to a grouping of memory cells 1 corresponding, for example, to a word as is the case in EEPROMs. Preferably, the selection transistor used is one that works by columns, half-columns columns of words or half-columns of words.

The node 3 could also be connected to the gate of the storage transistor 2 by using a voltage pump capable of providing substantial negative voltage, with the source being connected to a fixed positive voltage.

The first input of the comparator 12 can in fact be located on a node between any pair of impedors 6 to 11. It should however be noted that the shunting of an impedor 7 to 10 does not have exactly the same effect depending on whether the impedor is located between the output of the voltage pump 5 and the input of the comparator 12 or the input of the comparator 12 and the first reference voltage.

With regard to the operation of the device of FIG. 1, those skilled in the art will be able to refer to methods of erasure known in the prior art to obtain additional details on certain points that remain unchanged, especially as regards the testing of the memory cells and the pulse generator 18.

At the beginning of an erasure of all or part of a FLASH or EEPROM type memory, the initialization signal INIT will undergo a change of state that will initialize the logic circuit 17. The outputs of the logic circuit 17 will turn on for example all the shunt transistors 13 to 16 regulating the output of the voltage pump 5 at a minimal voltage. Then a pulse coming from the pulse generator 18 will turn the switch-over transistor 19 on, thus generating a pulse at the minimal voltage. The pulses sent have a fixed duration of 0.1 ms for example. After the sending of the pulse, the memory zone to be erased is tested in order to determine if the memory cells 1 are properly erased. The testing of the memory is done as in the prior art, i.e. the cells 1 are read by using a reference threshold corresponding to the erased level. Then groups of correctly erased cells are disconnected from the erasure device before the sending of a next pulse by the opening of a selection transistor disconnecting a column, a half-column, a column of words or a half-column of words of the memory. The logic circuit 17 will control the shunt transistors 13 to 16 so that the output voltage of the voltage pump 5 is preferably equal to or higher than the amplitude of the preceding pulse, by taking into account the number of pulses previously sent. Then a pulse is produced by the pulse generator 18. The operation is repeated until the erasure of all the memory cells 1, or until a maximum number of pulses has been sent. For FLASH memories, a partial programming of the cells that were depleted is done.

The use of groups of memory cells 1, for deselecting the storage transistors 2 during erasure, is strongly recommended for FLASH type memories in order to reduce the number of depleted cells to be partially programmed. Groups of cells that are locally grouped together will be taken, preferably grouped together in columns, half-columns, columns of words or half-columns of words, for the characteristics of the storage transistors 2 vary essentially according to their position in the memory array. The transistors of each group will thus have substantially identical characteristics.

The essential difference with respect to a prior art the erasure of non-volatile electrically erasable memories is that the amplitude of the resulting pulses sent to the memory varies as a function of the number of pulses previously sent. This enables the use of pulses that are shorter in duration and smaller in number. Moreover, disconnecting groups of cells considerably reduces the risk of depletion of the storage transistors.

The pulse sent may also not be sent to the source, the essential point being the creation of pulses between the gate and the source. In this case, the groups of cells will be preferably lines or half-lines.

Figure 2:
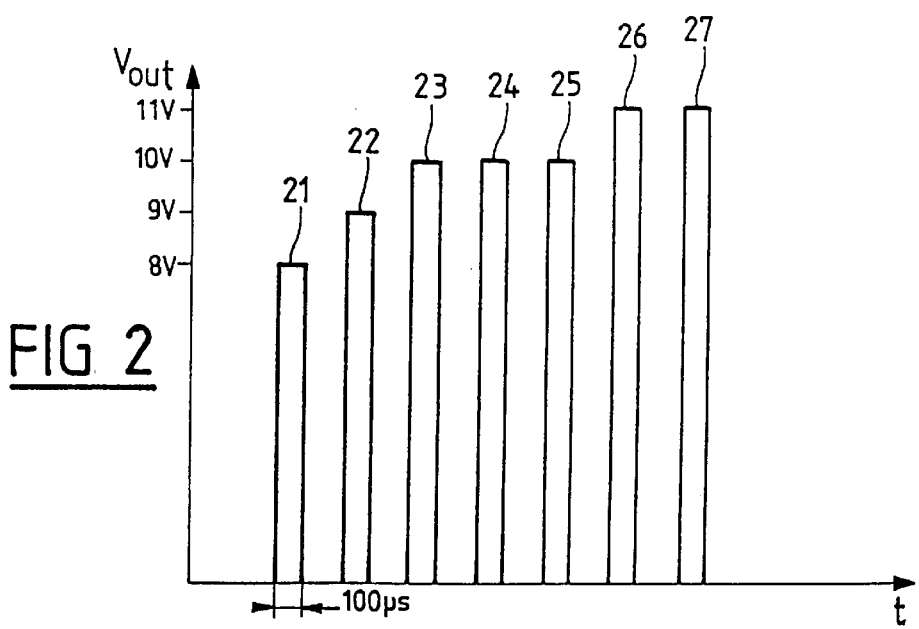
FIG. 2 shows an example of a pulse train produced in an embodiment of the present invention.

FIG. 2 illustrates the operation of the device of FIG. 1 and represents the voltage Vout present at the node 3. This FIG. 2 represents a succession of pulses 21 to 27 that is preferably sent. Each of the pulses 21 to 27 has a fixed duration in the present example, and lasts 0.1 ms. The example of FIG. 2 applies to memories where the source-gate erasure voltage is approximately 10V.

The first pulse 21 has an amplitude of 8V and is used to erase particularly sensitive cells. The second pulse 22 has an amplitude of 9V and is used to erase cells that are a little more sensitive than normal. The third, fourth and fifth pulses 23 to 25 have an amplitude of 10V and are used to erase cells that react normally. The sixth and seventh pulses 26 and 27 have an amplitude of 11V and are used to erase cells that arc more resistant to erasure.

Figure 3:
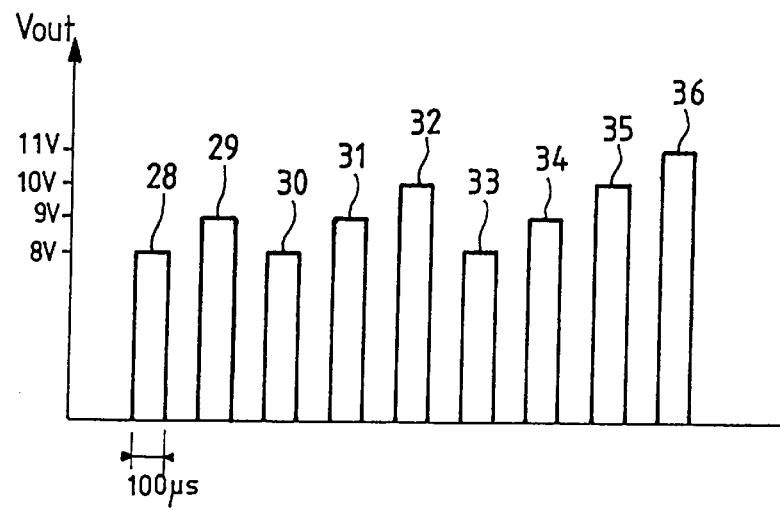
FIG. 3 shows another example of a pulse train produced in an embodiment of the present invention.

FIG. 3 shows a train of pulses 28 to 36 also designed to gradually erase the memory cells 1. The first pulse 28 has an amplitude of 8V and is used to erase particularly sensitive cells. The second pulse 29 has an amplitude of 9V and is used to erase cells that are a little more sensitive than normal. The third pulse 30 has an amplitude of 8V and is used to erase cells that have been made particularly sensitive by the preceding pulse 29. The fourth pulse 31 has an amplitude of 9V and is used to erase cells that have been made a little more sensitive than normal by the second pulse 29. The fifth pulse 32 has an amplitude of 10V and is used to erase the cells that react normally. The sixth pulse 33 has an amplitude of 8V and is used to erase cells made that have been made particularly sensitive by the preceding pulse 32. The seventh pulse 34 has an amplitude of 9V and is used to erase cells that have been made a little more sensitive than normal by the fifth pulse 32. The eighth pulse 35 has an amplitude of 10V and is used to erase the cells that react normally. The ninth pulse 32 has an amplitude of 11V and is used to erase the cells that are more resistant to erasure.

The knowledge provided by FIG. 2 and 3 should be considered in relation to the general form of the trains of pulses 21 to 27 and 28 to 36. Indeed, a range of variation of amplitude of preferably 10 to 20% around the mean erasure voltage is used in generating the pulses applied to the memory. It is possible to use greater numbers of pulses for values corresponding to the erasure mean. It is possible to use steady levels of voltage with constant steps or variable steps. It is also possible to use pulses of longer duration for the low voltage values and of shorter duration for the high voltage values.

Preferably, steps of constant value are used. Indeed, obtaining an increase in the erasure voltage by the addition of a constant step enables more efficient control of erasure. Moreover, a smaller number of steady levels of voltage will be used as compared with the number of pulses in order to reduce the amount of space taken up by the circuit.

In the prior art, the maximum number of pulses could reach 1000 for FLASH memories. With a gradual system enabling the use of voltages higher than those currently used, it is possible to reduce this maximum number of pulses to less than 20.

In FIGS. 2 and 3, the voltage steps are one-volt steps, but those skilled in the art will understand that steps that are greater or smaller than one-volt steps can be used. In practice, it is possible to use steps of 0.3V to 1.5V. A compromise needs to be found between the maximum number of pulses, the desired degree of gradualness, the erasure time and the amount of space taken up by the circuit.

As FIGS. 2 and 3 indicate, the possibilities that may be envisaged are very different and may be very numerous. The making of the logic circuit can therefore be highly varied.

By using four P type shunt transistors 13 to 16 that short-circuit identical impedors 7 to 10 whose short-circuiting entails a 1V reduction, an amplitude variation of 8V to 12V is obtained. A four-bit counter counting in natural binary mode may be used as the logic circuit 17. The outputs of this counter are connected to the gates of the shunt transistors 13 to 16. The amplitudes of the pulses, in the following order, will be: 8V, 9V, 9V, 10V, 9V, 10V, 10V, 11V, 9V, 10V, 0V, 11V, 10V, 11V, 11V, 12V. With the four-bit counter, the pulses are limited to a maximum of sixteen, which is sufficient. It can be seen that voltages of 8V and 12V are infrequently used as compared to the central voltage values.

Other counters may be used. In the same way, it is possible to add a decoder to the counter in order to obtain different pulse trains. In order to make the use of the decoder far more flexible, a small-sized ROM is used. This makes it possible to readjust the pulse train after having manufactured a first circuit by modifying only one mask level and preferably one level of metallization (as in ROM memories with strap programming).

Figure 4:
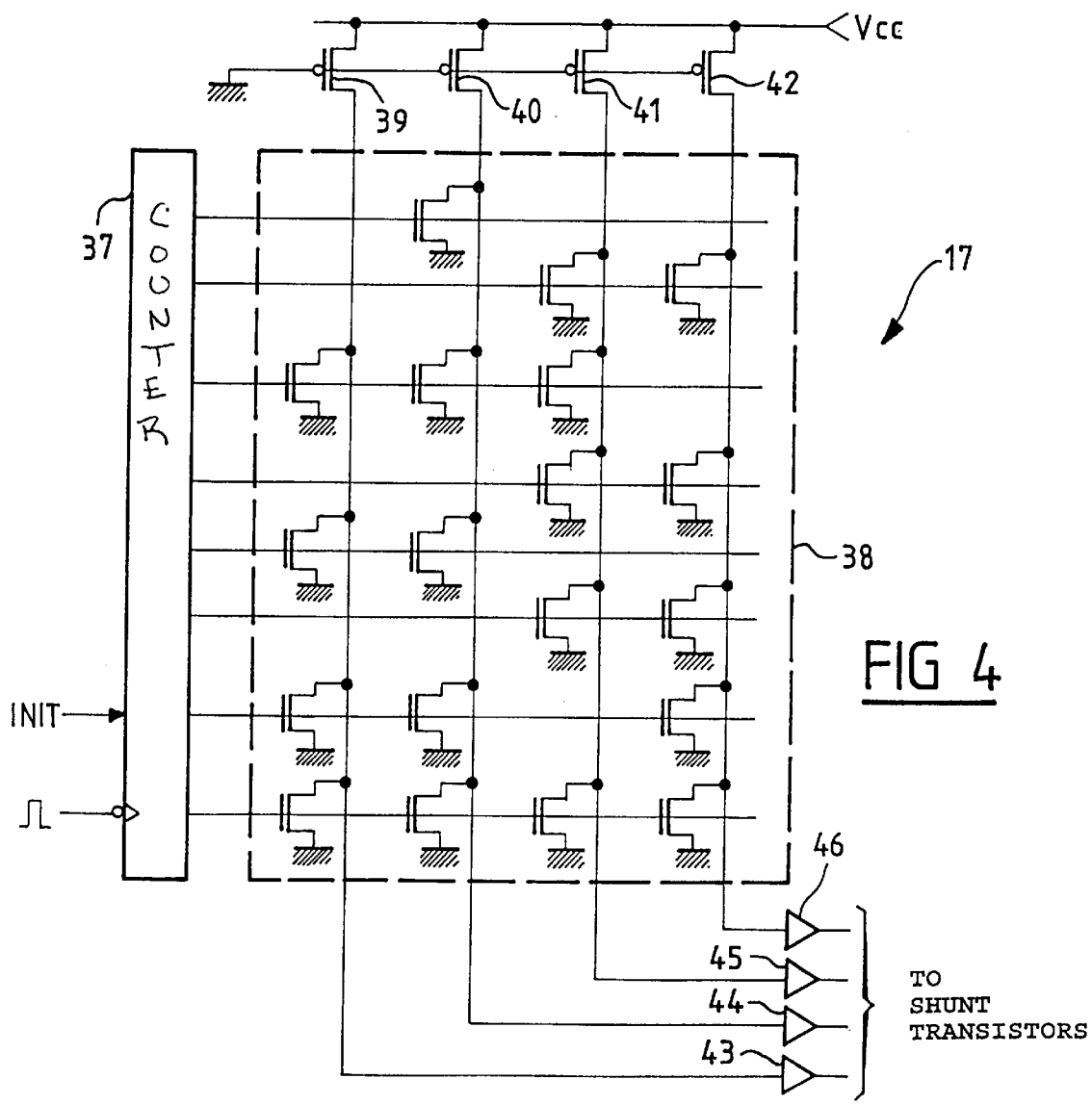
FIG. 4 shows a logic circuit that can be used to generate control signals in accordance with an embodiment of the invention.

FIG. 4 shows a preferred logic circuit using a shift register type (or Johnson counter) of counter 37, having one clock input, one initialization input and N outputs, and a ROM matrix 38 having N word lines and, for example, four bit lines. The N outputs of the counter 37 are connected respectively to N word lines of the matrix 38 so that each output of the counter 37 controls a word line directly. The counter 37 always has only one active output among its N outputs. The initialization input, receiving the signal INIT, makes the counter activate the first of its outputs at the time of the reception of a defined state of the signal INIT. The clock input is connected to the output of the pulse generator 18, so that each trailing edge of a pulse increments the counter 37 making the output of the previously active counter 37 inactive and activating the following output.

The four bit lines of the matrix 38 are connected, on the one hand, to the drains of four biasing transistors 39 to 42 and, on the other hand, to the inputs of four read amplifiers 43 to 46 respectively. The biasing transistors 39 to 42 are P type transistors having their gates connected to the ground and their sources connected to Vcc so that they are always on. The read amplifiers 43 to 46, each having one input and one output, perform two roles simultaneously. First, each amplifier 43 to 46 compares the voltage of the bit line that is associated with it with a reference voltage in order to determine if the bit line is connected to a selected word line by means of a storage transistor defining, by its presence or absence, if the corresponding value is a "zero" or a "one". The second role of the amplifiers 43 to 46 is to provide a control voltage for the shunt transistors 13 to 16.

The matrix 38 is preferably programmed on a level of metal, i.e. the presence or absence of a storage transistor is obtained by the presence or absence of a connection on a metallic level. The programming on a level of metal has the advantage, on the one hand, of requiring the modification only one mask and, on the other hand, of coming into play in one of the last phases of production, thus making it possible to very quickly modify the pulse train between two series of components.

The matrix 38 has four bit lines but the number will actually depend on transistor of shunt transistors 13 to 16 that will be actually used. The number of shunt transistors 13 to 16 will also depend on the number of voltage levels desired, the differences in values between the impedors 7 to 10 that will be shunted and the position of its impedors as compared with the comparator 12.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A circuit for the generation of erasure pulses for a non-volatile and electrically erasable memory comprising a pulse output connected to a switch controlled by a fixed-amplitude pulse generator, wherein said circuit for the generation of erasure pulses comprises:

a controllable voltage source, one voltage output of which is connected to the pulse output through the controlled switch; and a reaction circuit that acts on a control signal of the controllable voltage source as a function of the number of pulses already provided, the reaction circuit comprising a ROM type memory that includes a control sequence for the controllable voltage source and wherein the number and amplitudes of the pulses are predetermined.

2. The circuit according to claim 1, wherein the controllable voltage source comprises a voltage pump and wherein the reaction circuit controls an operating state of an oscillator associated with the voltage pump.

3. The circuit according to claim 2, wherein the reaction circuit comprises a bridge of impedors series-connected between a voltage output of the voltage pump and a first reference voltage, at least one of said impedors being short-circuited by at least one shunt transistor controlled by a logic circuit as a function of the number of pulses already provided.

4. The circuit according to claim 3, wherein a node between two impedors of the bridge of impedors is connected to a comparator which compares the voltage of the node with a second reference voltage in order to give the control signal of the controllable voltage source.

5. The circuit according to claim 3, wherein the logic circuit comprises a counter that receives an initialization signal at the beginning of an erasure sequence and has its pace set by the fixed-amplitude pulse generator, at least one output of the counter connected to the ROM memory.

6. The circuit according to claim 5, wherein the counter includes a shift register having at least one parallel output.

7. The circuit according to claim 6, wherein said at least one output of the shift register is directly connected to at least one word line of the ROM type memory.

8. The circuit according to claim 3, wherein a bit line of the ROM memory is connected to a gate of the at least one shunt transistor through an amplifier.

9. The circuit according to claim 1, wherein the ROM type memory is programmable on a metal layer.

10. A method for erasing a non-volatile and an electrically erasable memory including the steps of:

sending a predetermined sequence of pulses to an area of the memory to be erased; and varying an amplitude of the pulses as a function of a number of pulses previously sent wherein the amplitudes of the pulses are predetermined.

11. The method for erasing a non-volatile and electrically erasable memory according to claim 10, further including the steps of:

testing each storage transistor in the area of the memory to determine a state of the transistor; and determining after each pulse, whether to send another pulse.

12. The method for erasing a non-volatile and electrically erasable memory according to claim 11, further including:

disconnecting the storage transistors in the area of the memory with correctly erased cells from receiving an additional pulse.

13. The method for erasing a non-volatile and electrically erasable memory according to claim 10, wherein the step of varying the amplitude includes:

increasing a pulse voltage by a voltage that is a multiple of a constant step.

14. A circuit for the generation of variable-amplitude erasure pulses for a non-volatile and electrically erasable memory comprising:

a switch controlled by an output of a fixed-amplitude pulse generator, the switch connected to the memory;

a controllable voltage source, one voltage output of the controllable voltage source connected to the switch, the controllable voltage source producing variable-amplitude pulses; and a reaction circuit including an output to connected to the controllable voltage source and an input connected to the pulse generator, the reaction circuit providing a control sequence for the controllable voltage source, the control sequence varying as a function of the number of pulses previously received from the pulse generator, wherein the number and amplitudes of the pulses are predetermined.

15. The circuit for the generation of variable-amplitude erasure pulses according to claim 14, wherein the switch includes:
- a switch-over transistor with a drain connected to the output of the controllable voltage source, and a source connected to the memory;
- a logic signal amplifier, an input of the amplifier connected to the output of the pulse generator, and the output of the amplifier connected to the gate of the switch-over transistor.

16. The circuit for the generation of variable-amplitude erasure pulses claim 14, wherein the controllable voltage source includes a voltage pump and an oscillator, an operating state of the oscillator controlled by the reaction circuit.

17. The circuit for the generation of variable-amplitude erasure pulses according to claim 16, wherein the reaction circuit includes:
- a bridge of impedors series-connected between a voltage output of the voltage pump and a first reference voltage, at least one of the impedors being short-circuited by at least one shunt transistor; and
- a logic circuit, the at least one shunt transistor controlled by the logic circuit as a function of the number of pulses already provided.

18. The circuit for the generation of variable-amplitude erasure pulses according to claim 17, wherein the bridge of impedors includes a node between at least two impedors, the node connected to a comparator which compares the voltage of the node with a second reference voltage in order to give the control sequence to the controllable voltage source.

19. The circuit for the generation of variable-amplitude erasure pulses according to claim 17, wherein the logic circuit includes a ROM-type memory.

20. The circuit for the generation of variable-amplitude erasure pulses according to claim 19, wherein the logic circuit includes a counter that receives an initialization signal at the beginning of an erasure sequence, a pace of the counter set by the fixed-amplitude pulse generator, at least one output of the counter connected to the ROM memory.

21. The circuit for the generation of erasure pulses according to claim 20, wherein the counter includes a shift register having at least one parallel output.

22. The circuit for the generation of erasure pulses according to claim 21, wherein the at least one output of the shift register is directly connected to at least one word line of the ROM-type memory.

23. The circuit for the generation of variable-amplitude erasure pulses according to claim 19, wherein a bit line of the ROM memory is connected to a gate of the at least one shunt transistor by means of an amplifier.

24. The circuit for the generation of variable-amplitude erasure pulses according to claim 19, wherein the ROM type memory is programmable on a metal layer.

25. The circuit for the generation of variable-amplitude erasure pulses according to claim 14, wherein a range of variation of amplitude of 10 to 20% around the mean erasure voltage is used for the variable-amplitude erasure pulses.

* * * * *

UNITED STATES PATENT AND TRADEMARK OFFICE
CERTIFICATE OF CORRECTION

PATENT NO. : 6,011,724
DATED : January 4, 2000
INVENTOR(S) : Alessandro Brigati, Jean Devin and Bruno LeConte It is certified that error appears in the above-identified patent and that said Letters Patent is hereby corrected as shown below:

On the title page, item [57] should read:

ABSTRACT

Erasing a non-volatile and electrically erasable memory is performed using pulses. The amplitude of the pulses that are sent to erase the memory varies as a function of the number of pulses previously sent. A circuit generates erasure pulses of variable amplitude for erasing a non-volatile and electrically erasable memory.

Signed and Sealed this

Eighth Day of August, 2000

*Attest:*

Q. TODD DICKINSON

*Attesting Officer*   *Director of Patents and Trademarks*

UNITED STATES PATENT AND TRADEMARK OFFICE
CERTIFICATE OF CORRECTION

PATENT NO.    : 6,011,724
DATED         : January 4, 2000
INVENTOR(S)   : Alessandro Brigati, Jean Devin and Bruno LeConte It is certified that error appears in the above-identified patent and that said Letters Patent is hereby corrected as shown below:

<u>Title page,</u>
Item [73] should read as follows: [73] Assignee: SGS - Thomson Microelectronics S.A., Gentilly, France.

Signed and Sealed this

Eighteenth Day of September, 2001

*Attest:*

*Attesting Officer*

NICHOLAS P. GODICI
*Acting Director of the United States Patent and Trademark Office*